United States Patent [19]

Jackson et al.

[11] Patent Number: 5,081,425

[45] Date of Patent: Jan. 14, 1992

[54] VSWR ADAPTIVE POWER AMPLIFIER SYSTEM

[75] Inventors: Charles R. Jackson, St. Petersburg; Douglas R. Burke, Largo, both of Fla.

[73] Assignee: E-Systems, Inc., Dallas, Tex.

[21] Appl. No.: 527,777

[22] Filed: May 24, 1990

[51] Int. Cl.[5] .............................................. H03F 1/52
[52] U.S. Cl. ........................... 330/207 P; 330/124 R; 330/285; 330/295; 330/298
[58] Field of Search ............... 330/124 R, 127, 128, 330/207 P, 285, 295, 298; 361/79, 98; 455/117, 127

[56] References Cited

U.S. PATENT DOCUMENTS

| | | |
|---|---|---|
| 3,202,927 | 8/1965 | Ishimoto et al. .......................... 330/84 |
| 3,239,774 | 3/1966 | Tongue . |
| 3,263,172 | 7/1966 | Gunn . |
| 3,281,697 | 10/1966 | Hansen et al. . |
| 3,323,065 | 5/1967 | O'Connor . |
| 3,403,357 | 9/1968 | Rosen et al. ........................... 333/24 |
| 3,423,688 | 1/1969 | Seidel .................................... 330/53 |
| 3,426,290 | 2/1969 | Jensen . |
| 3,428,909 | 2/1969 | Kam et al. ......................... 330/139 X |
| 3,449,680 | 6/1969 | Schilb et al. ......................... 330/298 |
| 3,478,275 | 11/1969 | Walker ............................... 330/127 X |
| 3,510,790 | 5/1970 | Tahmisian, Jr. et al. ....... 330/117 X |
| 3,521,179 | 7/1970 | Blancke . |
| 3,644,832 | 2/1972 | Sherman, Jr. ..................... 330/285 X |
| 3,671,878 | 6/1972 | Becker ............................... 330/207 P |
| 3,714,601 | 1/1973 | Minton et al. . |
| 3,753,138 | 9/1973 | Svendsen ......................... 330/124 R |
| 3,962,648 | 6/1976 | Watson, Jr. ........................ 330/86 X |
| 3,996,524 | 12/1976 | Sechi . |
| 4,053,848 | 10/1977 | Kleische .............................. 330/53 |
| 4,064,464 | 12/1977 | Morse .................................. 330/53 |
| 4,114,108 | 9/1978 | Faulkenberry et al. ........ 330/207 P |
| 4,146,847 | 3/1979 | Otao et al. .......................... 330/297 |
| 4,187,471 | 2/1980 | Shimoji et al. ..................... 330/277 |
| 4,320,350 | 3/1982 | Drapac ............................ 330/285 X |
| 4,380,089 | 4/1983 | Weir ............................. 330/207 P X |
| 4,392,252 | 7/1983 | Cluniat ............................... 455/116 |
| 4,442,407 | 4/1984 | Apel .................................... 330/128 |
| 4,547,746 | 10/1985 | Erickson et al. ............... 330/129 X |
| 4,656,434 | 4/1987 | Selin .................................... 330/84 |

Primary Examiner—James B. Mullins
Attorney, Agent, or Firm—Harold E. Meier

[57] ABSTRACT

An adaptive power amplifier system for use with VSWR loads includes an adaptive power supply that indirectly monitors the power dissipated by a RF power amplifier and adapts bias conditions of solid state components in the RF power amplifier to protect the components from excessive power dissipation typically experienced with VSWR loads, even while maintaining full forward power output.

10 Claims, 2 Drawing Sheets

VSWR ADAPTIVE POWER AMPLIFIER SYSTEM

TECHNICAL FIELD

The invention relates to solid state amplifiers and power supplies for solid state amplifiers.

BACKGROUND OF THE INVENTION

A high power, solid state amplifier, when driving uncertain load impedances having a high voltage standing wave ratio (VSWR), may suffer from serious degradation in performance due to mismatched loads on the amplifier. For example, a radio frequency (RF) amplifier driving a transmission system with 50 ohms nominal impedance may be required to provide full forward power output into a load with a 3:1 VSWR. A class B amplifier operating under these conditions suffers from thermal and electrical stress, such as increased junction temperatures in its transistors, gain compression, and input mismatch conditions to the driver stage. Elevated junction temperatures in the solid state devices caused by high power dissipation in excess of that under normal operating conditions seriously reduces the device's reliability, with the resulting stress permanently damaging the critical solid state devices.

One technique for mitigating the adverse effects of abnormal load impedances from a high VSWR load is isolating the load. An example of this technique involves placing a magnetic isolator at the output of each solid state device. Under high VSWR conditions, power reflected by the load is absorbed in a dump port termination. Other techniques use a VSWR detection circuit to monitor the load status and provide a control signal to initiate the reduction of the power output of the amplifier to a safe operating value.

In high power systems requiring constant forward output power, these approaches are not feasible because a constant forward output power from the amplifier is not maintained. An approach that protects the solid state components from high power dissipation but that also maintains full power output substantially independent of the load VSWR is most desirable.

SUMMARY OF THE INVENTION

In accordance with the invention, solid state components of an amplifier are protected from excess power dissipation with minimum affect on the forward power output of the amplifier. A dynamic feedback system and a power source comprise an adaptive power supply for the amplifier. The dynamic feedback system monitors the power drawn by the amplifier and, thereby, indirectly monitors the solid state components for a high or excessive power dissipation resulting from VSWR load conditions, that, in turn, can cause elevated junction temperatures and poor efficiency. The adaptive power supply, when a high dissipation condition is sensed, dynamically adapts the amount of power supplied to, and thereby the bias voltages of, the solid state devices to reduce dissipation and maintain nearly constant operation efficiency. The selection of the proper feedback response maintains optimum power input and, consequently, full forward output power of the amplifier as the bias condition of the solid state components are adapted.

DETAILED DESCRIPTION OF THE DRAWINGS

Figure 1:
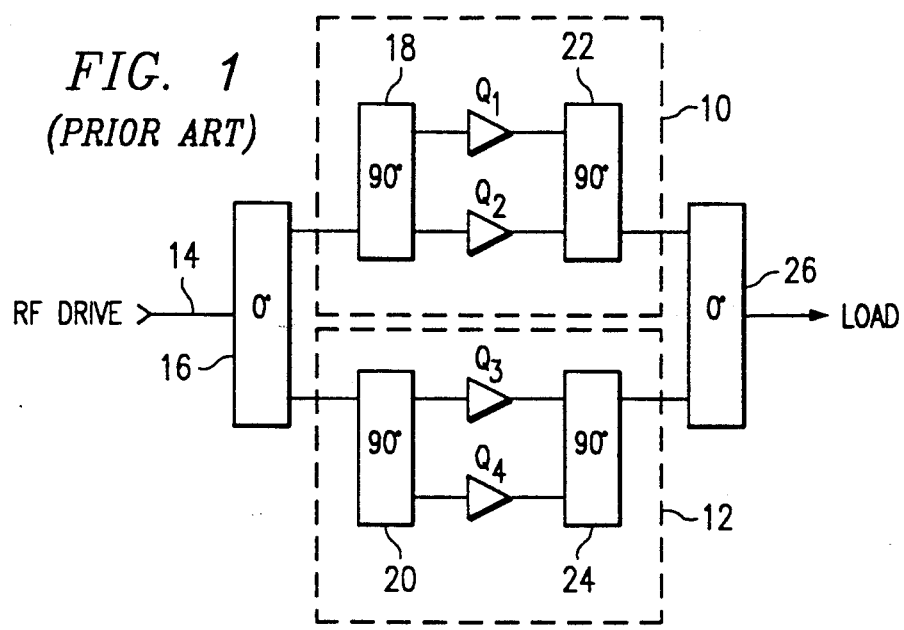
FIG. 1 is a block diagram of a radio frequency (RF) power amplifier.

FIG. 1 is a block diagram of a RF power amplifier that is designed to operate in the frequency range of 225 to 400 MHz. It includes a pair of 90° hybrid coupled amplifiers, 10 and 12. The RF signal to be transmitted is received on line 14 by hybrid coupler 16, which in turn provides the signal to each of hybrid amplifiers 10 and 12. Within each hybrid amplifier, second hybrid couplers 18 and 20, respectively, split the RF signals again such that the RF signals supplied to transistors Q1 and Q3 are in-phase and the RF signals supplied to transistors Q2 and Q4 are in-phase, but 90° out of phase with the RF signals supplied to transistors Q1 and Q3. The outputs of transistors Q1 and Q2 are combined with hybrid coupler 22, and the outputs of transistors Q3 and Q4 are combined in a hybrid coupler 24. Hybrid coupler 26 combines the outputs of the two hybrid couplers to form an amplified RF signal that is coupled to the load.

The RF power amplifier of FIG. 1 is an example of a type of power amplifier utilized in connection with the invention to be subsequently described. As will be apparent, the invention may also be used with an amplifier having a single solid state device, as well as with one having multiple, parallel stages.

Figure 2:
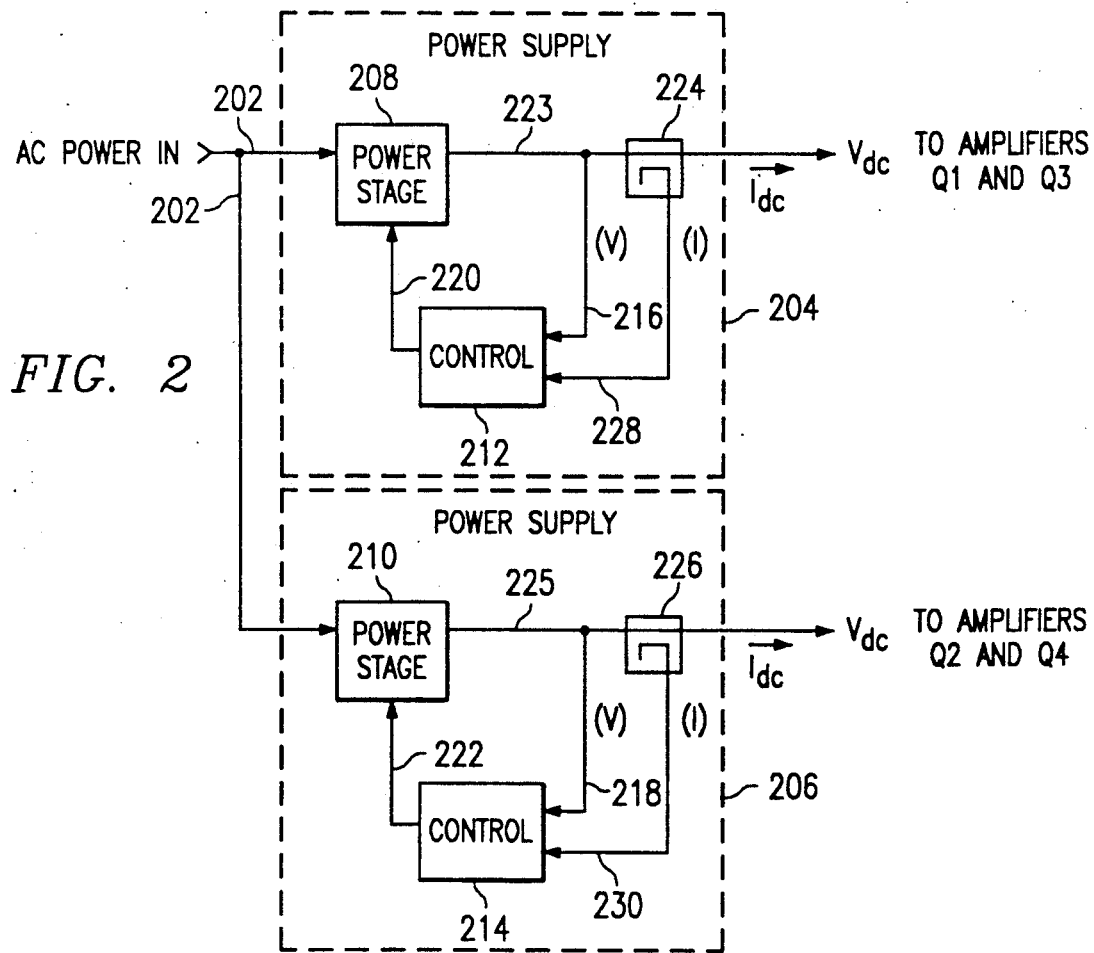
FIG. 2 is a block diagram of a VSWR adaptive power supply for the power amplifier of FIG. 1.

Referring now to FIG. 2, a block diagram of an adaptive power supply in accordance with the teachings of the invention, for use with the RF power amplifier described in FIG. 1 is depicted. It comprises two power supplies 204 and 206.

Power supply 204 provides an output voltage coupled to transistors Q1 and Q3 operating in phase, and power supply 206 provides an output voltage coupled to transistors Q2 and Q4 operating in phase. Alternating current (AC) power at 400 Hz is supplied on lines 202 to each of the power supplies 204 and 206. A power stage 208 or 210 in each power supply 204 and 206 respectively, converts the 400 Hz AC power to a DC voltage. In the preferred embodiment, the power stages are switching power converters.

Associated with each power stage 208 and 210 are control circuits 212 and 214 respectively. A control circuit forms part of a dynamic control loop that controls the voltage (Vdc) of the output of the power stage associated with the particular control circuit. The control circuits 212 and 214 sample Vdc of power stages 208 and 210 by lines 216 and 218, respectively.

The control circuits 212 and 214 also form part of current control loops that sample the dc load currents (Idc) of the output power signals on lines 223 and 225 using current sampling devices 224 and 226, respectively. The current control loops provide a current feedback signal representative of Idc to control circuits 212 and 214 by connecting lines 228 and 230, respectively.

In response to the feedback voltage on lines 216 and 218, and the current feedback on line 228 and 230, control circuits 212 and 214 generate control signals such that Vdc of the output of the respective power stages 208 and 210 follow a predetermined voltage and current characteristic.

The use of dual power stages is intended to be illustrative of only one possible application of an adaptive power supply in accordance with the present invention. For example, only a single stage power supply is required for a power amplifier with transistors that are not operating in quadrature phase. The single power stage may supply the Vdc signal to one or a plurality of parallel transistors operating in phase with one another, the number of transistors being limited only by ability of the power stage to supply the required power.

Figure 3:
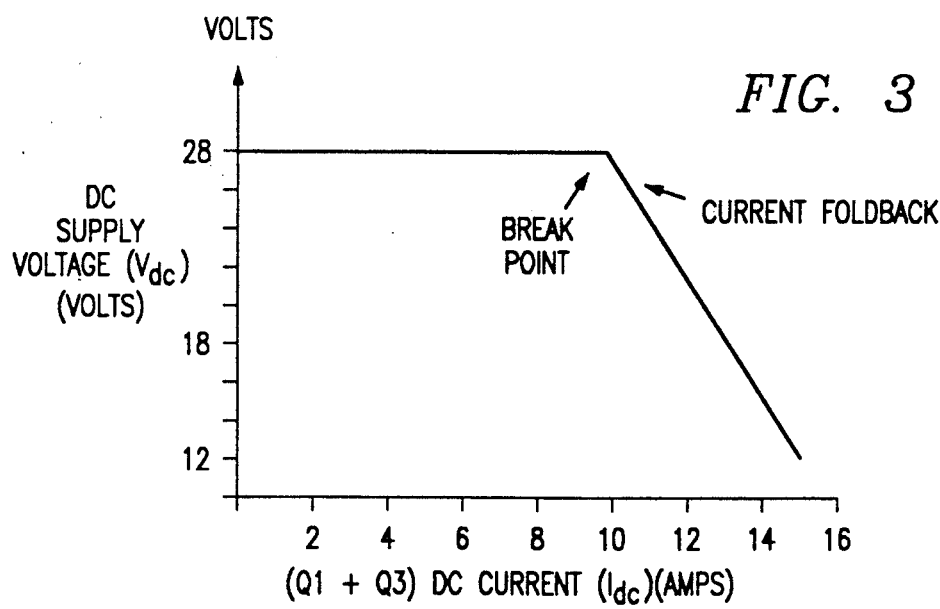
FIG. 3 is a graphical representation of the dc supply voltage versus the dc supply current characteristic of the adaptive power supply of FIG. 2.

Now referring to the graph of FIG. 3, each control circuit controls the output voltage level of a power stage in accordance with the voltage and current characteristic shown by the graph. The voltage feedback loop of each circuit maintains a steady voltage at 28 volts for Idc between 0 and 10 amps. At 10 amps, as indicated by a "break point", the current feedback loop "foldbacks" Vdc as Idc increases past the break point. The graph demonstrates a linear relationship between Vdc and Idc during the foldback that maintains power supplied to the RF power amplifier at a fixed wattage level. The RF power amplifier shown in FIG. 1, with the adaptive power supply of the present invention generating this voltage and current characteristic, has been shown to maintain a 250 watt power output into a 3 to 1 VSWR load.

The Vdc and the Idc at breakpoint and the slope of the foldback are chosen for a particular application depending on the particular RF power amplifier and the expected VSWR load condition on the output of the power amplifier. The foldback characteristic is adaptable to any VSWR condition. Furthermore, the voltage and current characteristic need not necessarily be linear. Although it is shown to be piece-wise linear, the voltage and current characteristic may be customized for the particular application with a non-linear function or programmed with an empirically determined voltage and current relationship that avoids the deleterious affects of excessive power dissipation while maintaining the desired power output.

Figure 4:
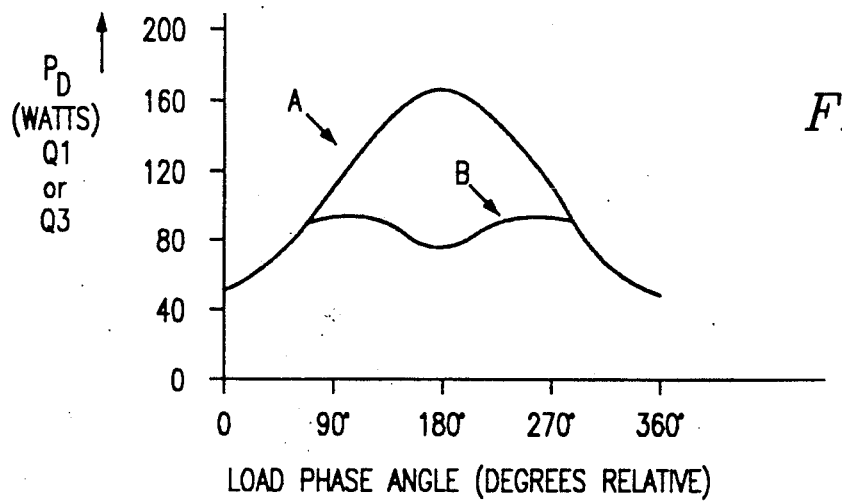
FIG. 4 is a waveform illustrating test measurements of the power dissipated by one amplifier transistor in the RF power amplifier of FIG. 1, both with (line B) and without (line A) the VSWR adaptive power supply of FIG. 2, plotted against the phase of the VSWR load.

Referring now to the waveform in FIG. 4, this waveform plot illustrates power dissipated by the transistor Q1 or Q3, of the power amplifier shown in FIG. 1, versus a load phase under a 3 to 1 VSWR load. The curve designated "A" represents power dissipated by a transistor that is supplied by a non-adaptive power supply without the voltage foldback feature. The curve designated by "B" represents power dissipated by a transistor when the voltage to the transistor is supplied by the adaptive power supply operated according the present invention. The plot demonstrates a reduction in the amount of power dissipated by a transistor supplied by the adaptive power supply and relatively constant power dissipation for providing constant transistor efficiency.

Figure 5:
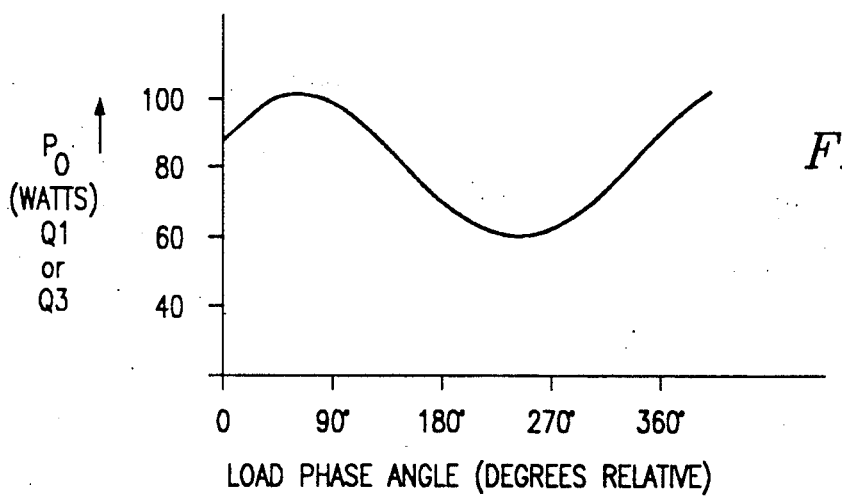
FIG. 5 is a graph of test measurements plotting RF power output of one of the amplifiers using the VSWR adaptive power supply, against the phase of a VSWR load.

Referring now to FIG. 5, the waveform plot illustrates the RF power output of transistor Q1 or Q3 of the RF power amplifier depicted by FIG. 1 with the RF power amplifier coupled to the adaptive power supply of the invention, versus the load phase. The load is a 3 to 1 VSWR load and the dual output of Q1 and Q3 equals 125 watts total. The plot shows an RF power output substantially identical to that of an RF power amplifier, with a non-adaptive power supply, thus, demonstrating that use of the adaptive power supply in accordance with the present invention does not reduce the forward power output of a RF power amplifier.

While the invention has been described in connection with a preferred embodiment, it is not intended to limit the scope of the invention to the particular form set forth, but, on the contrary, it is intended to cover alternatives, modifications, equivalents as may be included within the spirit and scope of the invention as defined in the appended claims.

We claim:
1. A power supply for a power amplifier, comprising:
 a power stage for generating a power signal having an adjustable voltage level, said power signal applied to the power amplifier;
 means for sensing the current level and voltage level supplied by the power stage and dissipated by the amplifier and, in response thereto, generating a feedback control signal coupled to the power stage to maintain a substantially constant voltage level until the current level of the power signal reaches a predetermined threshold current level and thereafter adjust the voltage level of the power signal to cause the voltage level of the power signal to decrease in linear proportion to an increase in the current level.

2. The power supply according to claim 1 wherein the means for sensing generates the feedback control signal to maintain the voltage level of the power signal for a predetermined power dissipation in accordance with a predetermined power supply output voltage versus output current characteristic.

3. The power supply according to claim 1 wherein the means for sensing includes means for generating a voltage feedback signal representative of the sensed output voltage level of the power signal.

4. The power supply according to claim 3 wherein the means for sensing further includes means for generating a current feedback signal representative of the sensed output current level of the power signal.

5. The power supply according to claim 4 wherein the means for sensing further includes a control circuit for generating the feedback control signal to the power stage in response to the voltage and current feedback signals to control the voltage level of the power signal.

6. A method for regulating a power supply for a power amplifier having a power input, comprising the steps of:
 measuring the voltage and current level of a power signal supplied by the power supply to the power amplifier; and
 adjusting the voltage level of the power signal supplied to the power amplifier according to a predetermined power supply output voltage versus output current characteristic, wherein the step of adjusting comprises the steps of:
 (a) maintaining a substantially constant voltage level for measured current levels below a predetermined threshold current level; and (b) reducing the voltage level for measured current levels of the power signal above the predetermined threshold current level.

7. The method according to claim 6 wherein the step of reducing the voltage level of the power signal further includes the step of reducing the voltage level to maintain substantially constant amplifier power output for measured current levels of the power signal exceeding the predetermined threshold current level.

8. The method according to claim 6 wherein the step of reducing the voltage level of the power signal includes the step of the reducing the power signal voltage level in linear proportion to measured increases in the power signal current level exceeding the predetermined threshold current level.

9. A power amplifier for producing a high power output into uncertain load impedances, comprising:
 a power amplifier having an output coupled to the load impedance and a power input; and
 an adaptive power supply coupled to the power amplifier, the adaptive power supply including means for measuring the current level and voltage level supplied to and drawn by the amplifier and means for adjusting the voltage supplied by the power supply in response to the measured current and voltage levels to maintain substantially constant voltage level for current level increases until the measured current level reaches a predetermined threshold current level, the means for adjusting thereafter reducing the voltage level as the measured current level increases above the predetermined threshold current level.

10. The power amplifier system for producing a high power output into uncertain load impedances according to claim 9, wherein:
 the power amplifier comprises a plurality of amplifier stages coupled in parallel, each stage including a first amplifier operating in phase with the first amplifier of each of the other stages and a second amplifier operating in quadrature phase with the first amplifier; and
 the adaptive power supply includes a primary power supply coupled to a first power supply stage and a second power supply stage, the first power supply stage being coupled to the first amplifiers of each stage and the second power supply being coupled to the second amplifier of each stage.

* * * * *